(12) United States Patent
Babcock et al.

(10) Patent No.: US 6,774,455 B2
(45) Date of Patent: Aug. 10, 2004

(54) SEMICONDUCTOR DEVICE WITH A COLLECTOR CONTACT IN A DEPRESSED WELL-REGION

(75) Inventors: Jeffrey A. Babcock, Richardson, TX (US); Christoph Dirnecker, Amper (DE); Angelo Pinto, Allen, TX (US); Scott G. Balster, Munich (DE); Michael Schober, Freising (DE); Alfred Haeusler, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/262,206

(22) Filed: Sep. 30, 2002

(65) Prior Publication Data

US 2003/0062589 A1 Apr. 3, 2003

Related U.S. Application Data

(60) Provisional application No. 60/326,594, filed on Oct. 1, 2001.

(51) Int. Cl.[7] .............................................. H01L 29/737
(52) U.S. Cl. ........................ 257/526; 257/197; 257/586
(58) Field of Search ................................. 257/187, 197, 257/198, 565–593, 526

(56) References Cited

U.S. PATENT DOCUMENTS

| | | | | |
|---|---|---|---|---|
| 5,216,271 A | * | 6/1993 | Takagi et al. | ................ 257/370 |
| 5,365,090 A | * | 11/1994 | Taka et al. | ................... 257/197 |
| 6,236,071 B1 | * | 5/2001 | Finlay | ........................ 257/197 |
| 6,396,107 B1 | * | 5/2002 | Brennan et al. | ............ 257/362 |
| 2001/0013610 A1 | * | 8/2001 | Chi et al. | .................... 257/197 |

* cited by examiner

Primary Examiner—Long Pham
Assistant Examiner—Marcos D. Pizarro-Crespo
(74) Attorney, Agent, or Firm—Wade James Brady, III; Frederick J. Telecky, Jr.

(57) ABSTRACT

A method for manufacturing a semiconductor device includes forming a buried layer of a semiconductor substrate. An active region is formed adjacent at least a portion of the buried layer. At least part of the active region is removed to form a shallow trench opening. A dielectric layer is formed proximate the active region at least partially within the shallow trench opening. At least part of the dielectric layer is removed to form a collector contact region. A collector contact may be formed at the collector contact region. The collector contact may be operable to electrically contact the buried layer.

9 Claims, 5 Drawing Sheets

SEMICONDUCTOR DEVICE WITH A COLLECTOR CONTACT IN A DEPRESSED WELL-REGION

RELATED APPLICATIONS

This application claims priority under 35 USC 119(e)(1) of provisional application No. 60/326,594 filed Oct. 1, 2001.

TECHNICAL FIELD OF THE INVENTION

This invention relates generally to semiconductor devices and, more specifically, to a semiconductor device with a shallow trench collector contact region and a method of manufacturing the same.

BACKGROUND OF THE INVENTION

In advanced bipolar and BiCMOS technologies, electrical contact to buried layers plays a key role in the performance of the technology. A sinker contact is generally required to reduce the resistance of the collector contact. In a standard process integration sequence, collector sinkers are realized by using high-energy ion implantation of p-type or n-type dopants into the collector epitaxy. Dopant activation and diffusion are then realized by a thermal step (furnace or rapid thermal anneal). The diffusion penetrates into the collector epitaxial layer to contact the underlying buried layer.

To accomplish this, one or two lithographic steps are necessary to selectively introduce dopants into the collector epitaxy. Moreover, high-energy high-dose ion implant capability is used for higher voltage applications in which thick collector epitaxy is used to guarantee high breakdown characteristics.

This can lead to a bottleneck in manufacturing since the total time required to achieve the proper dose at these energies is limited by the equipment and thus slows down the processing of wafers. Furthermore, high energy implants require significantly thicker photoresist masks which make it more difficult to control critical dimensions during implants. It is also possible that some of the high energy implants can reach through the photoresist and potentially contaminate critical devices or structures.

SUMMARY OF THE INVENTION

The present invention provides a semiconductor device and method for manufacturing the same that substantially eliminates or reduces at least some of the disadvantages and problems associated with the previously developed semiconductor devices and methods for manufacturing the same.

In accordance with a particular embodiment of the present invention, a method for manufacturing a semiconductor device includes forming a buried layer of a semiconductor substrate. An active region is formed adjacent at least a portion of the buried layer. At least part of the active region is removed to form a shallow trench opening. A dielectric layer is formed proximate the active region at least partially within the shallow trench opening. At least part of the dielectric layer is removed to form a collector contact region. A collector contact may be formed at the collector contact region. The collector contact may be operable to electrically contact the buried layer.

In accordance with another embodiment, a semiconductor device includes a buried layer of a semiconductor substrate. An active region is adjacent at least a portion of the buried layer. A shallow trench isolation structure is adjacent at least a portion of the active region. A collector contact region is adjacent at least a portion of the shallow trench isolation structure. The collector contact region has a depth approximately equal to a depth of the shallow trench isolation structure. The semiconductor device may include a collector contact formed at the collector contact region. The collector contact may be operable to electrically contact the buried layer.

Technical advantages of particular embodiments of the present invention include a method of manufacturing a semiconductor device utilizing shallow trench isolation to make an electrical contact with a buried layer. Such a method requires less lithographic steps to complete the manufacturing process since separate sinker masks are not needed to electrically contact the buried layer. Accordingly, the total time it takes to manufacture the semiconductor device and the labor resources and costs required are reduced.

Another technical advantage of particular embodiments of the present invention includes a method of manufacturing a semiconductor device that does not require high energy ion implantation to make the contact between a collector and the buried layer since the collector can be formed within a shallow trench and therefore closer in proximity to the buried layer. This can reduce the amount of time it takes to manufacture semiconductor device. It can also decrease the potential for contamination of critical devices or structures since the use of high energy implants can lead to such contamination during the manufacturing process.

Other technical advantages will be readily apparent to one skilled in the art from the following figures, descriptions and claims. Moreover, while specific advantages have been enumerated above, various embodiments may include all, some or none of the enumerated advantages.

BRIEF DESCRIPTION OF THE DRAWINGS

For a more complete understanding of the particular embodiments of the invention and their advantages, reference is now made to the following descriptions, taken in conjunction with the accompanying drawings, in which.

DETAILED DESCRIPTION OF THE INVENTION

Figure 1:
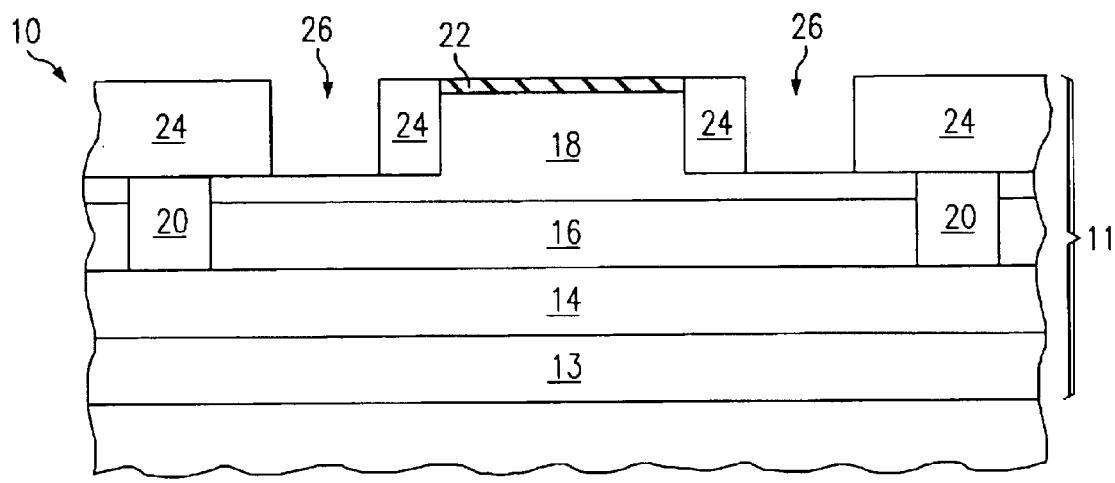
FIG. 1 is a cross-sectional diagram illustrating a semiconductor device with collector contact regions at one stage of a manufacturing process, in accordance with a particular embodiment of the present invention.

FIG. 1 illustrates a semiconductor device 10 at one stage of a manufacturing process, in accordance with an embodiment of the present invention. Semiconductor device 10 includes collector contact regions 26 formed using methods of the present invention. Collector contact regions 26 provide areas for collector contacts to be subsequently formed. Collector contact regions 26 are formed between shallow trench isolation structures 24. Subsequently forming collector contacts within collector contact regions 26 will facilitate electrical contact between the collector contacts and a buried layer 16. Such electrical contact allows for the flow of an electrical current between the collector contacts and buried layer 16.

Forming collector contact regions 26 and locating collector contacts within such regions requires less lithographic steps to complete the manufacturing process since sinkers are not needed to make the electrical contact with the buried layer. Furthermore, high energy ion implantation is not required for a collector to electrically contact the buried layer since the collector can be formed within collector contact regions 26. This can reduce the amount of time it takes to manufacture semiconductor device 10. It can also decrease the potential for contamination of critical devices or structures since the use of high energy implants can lead to such contamination during the manufacturing process.

Semiconductor device 10 includes semiconductor substrate 11 which comprises a wafer 13. As discussed in greater detail below, in this embodiment semiconductor substrate 11 also includes an oxide layer 14 and a buried layer 16. An active region 18 is disposed adjacent buried layer 16. Deep trench isolation structures 20 are also adjacent buried layer 16. A nitride layer 22 is adjacent active region 18.

Figure 2:
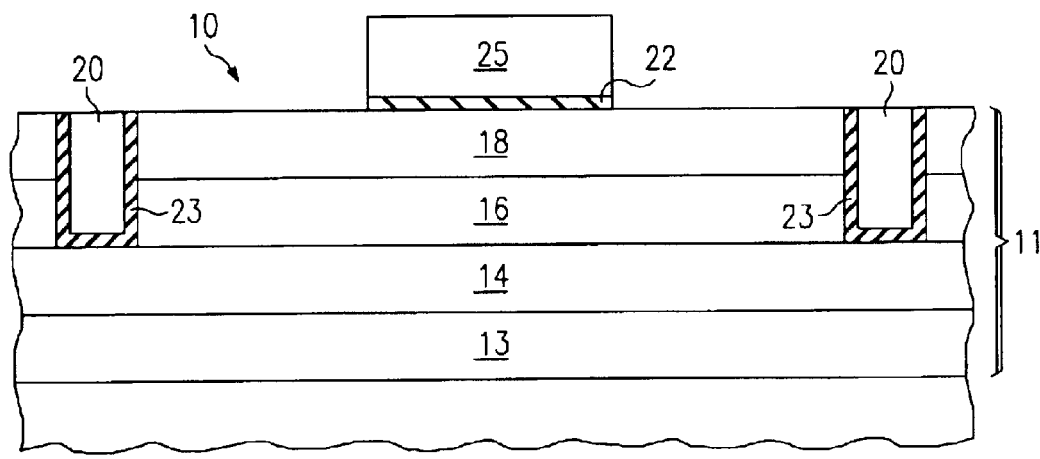
FIG. 2 is a cross-sectional diagram illustrating a semiconductor device with an active region and a buried layer at one stage of a manufacturing process, in accordance with a particular embodiment of the present invention.

FIG. 2 illustrates a semiconductor device 10 at one stage of a manufacturing process, in accordance with an embodiment of the present invention. Semiconductor substrate 11, comprises wafer 13, which is formed from a single crystalline silicon material. Semiconductor substrate 11 may comprise other suitable materials or layers without departing from the scope of the present invention. For example, semiconductor substrate 11 may include a recrystallized semiconductor material, a polycrystalline semiconductor material or any other suitable semiconductor material.

Semiconductor device 10 includes an oxide layer 14. Oxide layer 14 may be formed by any of a variety of techniques well known to those skilled in the art and may comprise any suitable oxide. Other embodiments of the present invention may not include an oxide layer.

Buried layer 16 is formed within semiconductor substrate 11 using any of a variety of techniques well known to those skilled in the art. Buried layer 16 may either be negatively-doped to form a negative buried layer ("NBL") or positively-doped to form a positive buried layer ("PBL"). In an NBL, electrons conduct electricity during operation of semiconductor device 10, while holes conduct electricity in a PBL. Any of a number of dopants may be used to form an NBL, such as arsenic, phosphorus or antimony; and dopants such as boron or indium may be used to form a PBL.

Active region 18 is formed adjacent buried layer 16. Active region 18 is a substantially undoped or lightly doped region. Active region 18 may contain some diffusion of atoms from buried layer 16 migrating upward. Active region 18 may be formed by any of a variety of techniques well known to those skilled in the art, such as epitaxial growth.

In the illustrated embodiment, deep trench isolation structures 20 are formed adjacent buried layer 16. Deep trench isolation structures 20 provide isolation between elements of semiconductor device 10 during use of semiconductor device 10. Other embodiments of the present invention may or may not include deep trench isolation structures 20 or may provide isolation between elements of a semiconductor device in other ways, such as through diffusion.

Deep trench isolation structures 20 may be formed using photoresist and etching. Other means known to those of ordinary skill in the art may also be used to form deep trench isolation structures 20. Deep trench isolation structures 20 may be filled with a suitable semiconductive material such as intrinsic polycrystalline silicon or a suitable insulative material such as silicon dioxide. Such material may be deposited within deep trench isolation structures 20 using a suitable deposition process such as chemical vapor deposition. Deep trench isolation structures include a liner oxide 23 formed around at least some of the edges of deep trench isolation structures 20 in accordance with techniques well known to those of ordinary skill in the art. Other embodiments may not include liner oxide 23.

Nitride layer 22 is formed adjacent active region 18. Nitride layer 22 may be formed by any of a variety of techniques well known to those of ordinary skill in the art. For example, a nitride may be deposited upon active region 18. A photoresist may be formed upon the nitride. A solvent may be used to remove portions of the photoresist and the deposited nitride, leaving photoresist portion 25 and nitride layer 22. Other embodiments of the invention may or may not include nitride layer 22.

Figure 3:
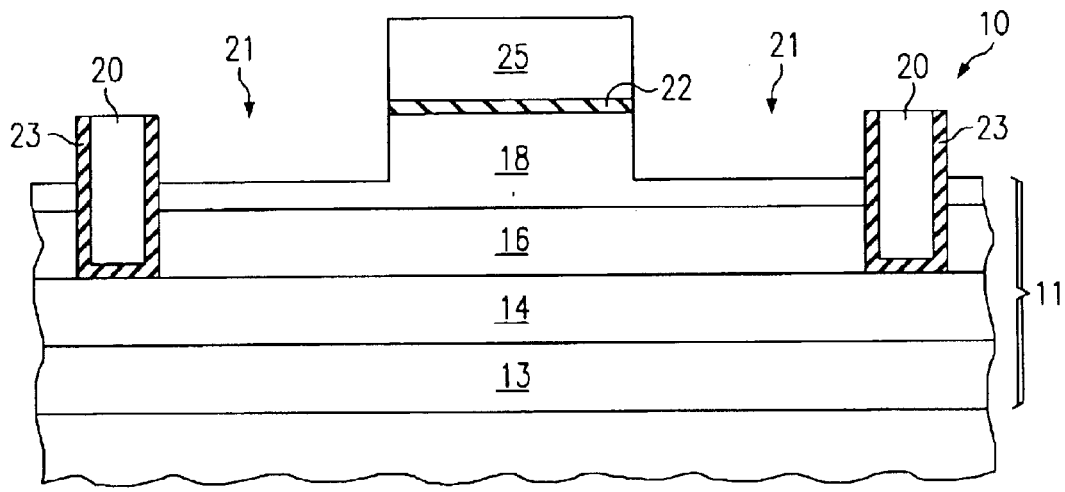
FIG. 3 is a cross-sectional diagram illustrating the semiconductor device of FIG. 2 at another stage of a manufacturing process showing openings for shallow trench isolation structures and collector contact regions, in accordance with a particular embodiment of the present invention.

FIG. 3 illustrates semiconductor device 10 of FIG. 2 at a further stage in the manufacturing process. Openings 21 have been formed through a masking and etching process. Portions of active region 18 have been etched away in the formation of openings 21. Openings 21 provide a location for subsequent formation of shallow trench isolation structures and collector contact regions, discussed in greater detail below.

Figure 4:
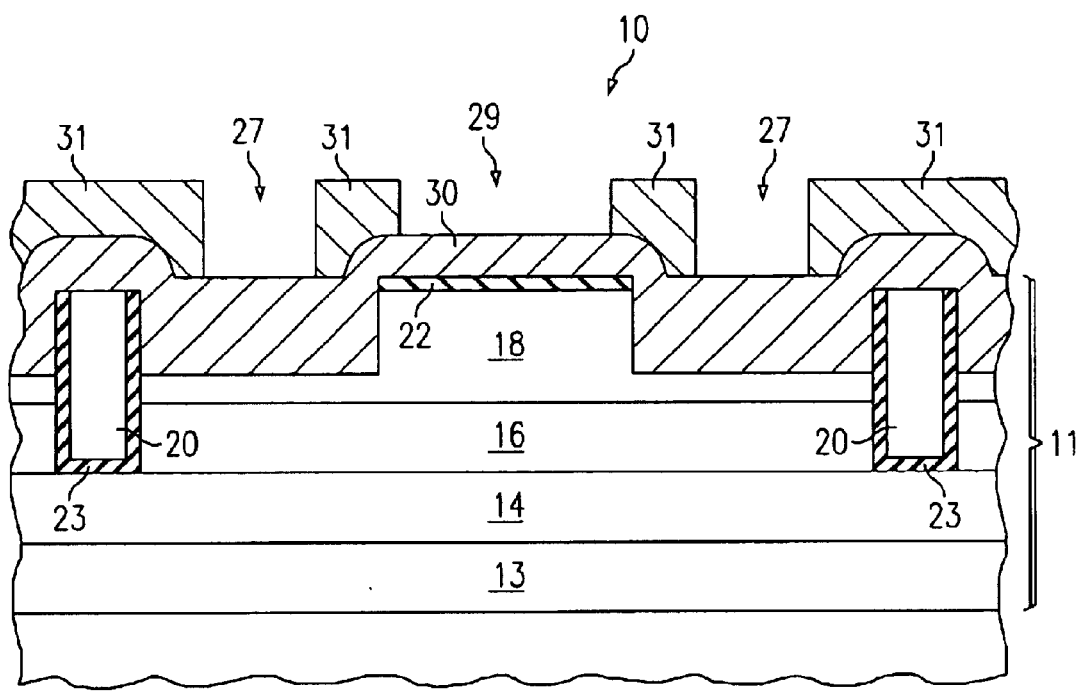
FIG. 4 is a cross-sectional diagram illustrating the semiconductor device of FIG. 3 with a dielectric layer and photoresist at another stage of a manufacturing process, in accordance with a particular embodiment of the present invention.

FIG. 4 illustrates semiconductor device 10 of FIG. 3 at a further stage in the manufacturing process. Dielectric layer 30 is formed adjacent active region 18. Dielectric layer 30 may comprise any suitable dielectric, such as tetraethyl orthosilicate (TEOS) or borophosphosilicate glass (BPSG). Dielectric layer 30 may also comprise a material with a low dielectric coefficient. Dielectric layer 30 may be formed by any of a variety of techniques well known to those of ordinary skill in the art.

Semiconductor device 10 may also include other layers, such as a liner oxide formed prior to the formation of dielectric layer 30. Such liner oxide may have a thickness on the order of ten nanometers.

A photoresist is formed adjacent dielectric layer 30. An reverse shallow trench isolation ("RSTI") mask is used to cover the photoresist in all areas except area 29 above an active region 18 and areas 27 above where collector contacts will be formed later in the manufacturing process. The photoresist is then exposed to a solvent which removes portions of the photoresist not covered by the RSTI mask, leaving photoresist 31 adjacent dielectric layer 30.

Figure 5:
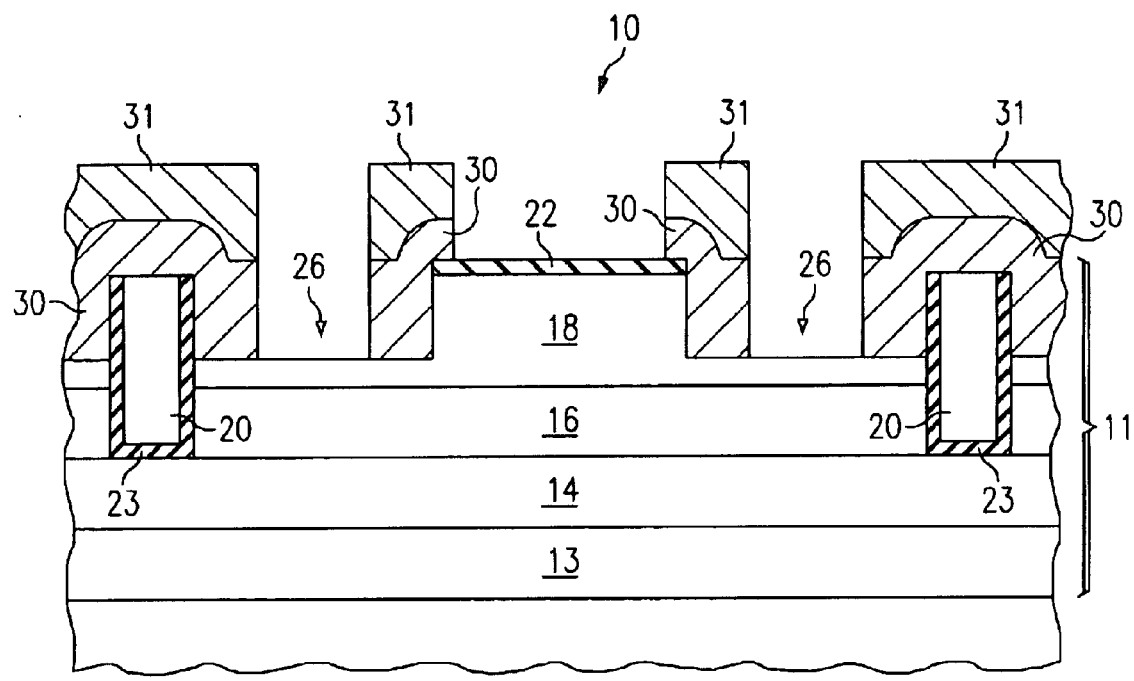
FIG. 5 is a cross-sectional diagram illustrating the semiconductor device of FIG. 4 with collector contact regions at another stage of a manufacturing process, in accordance with a particular embodiment of the present invention.

FIG. 5 illustrates semiconductor device 10 of FIG. 4 at a further stage in the manufacturing process. Collector contact regions 26 have been formed. An etchant, plasma or other material is used to react with the areas of dielectric layer 30 of FIG. 4 which were not covered by photoresist 31. Such areas of dielectric layer 30 are etched away leaving collector contact regions 26 where collector contacts will be subsequently formed. Collector contact regions 26 may have a depth of approximately 3,000 to 10,000 angstroms.

Figure 6:
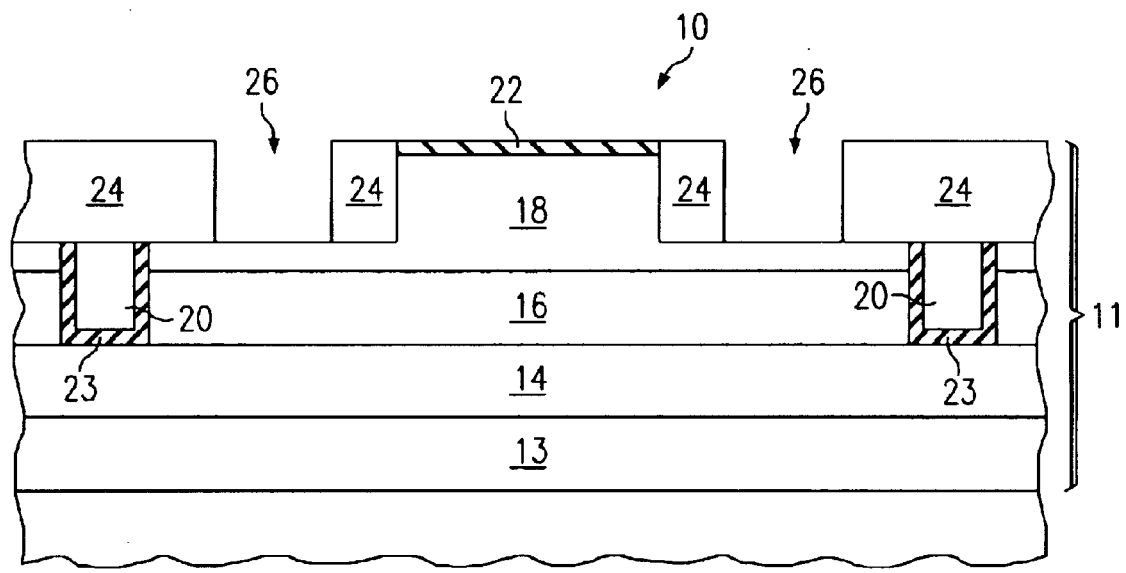
FIG. 6 illustrates semiconductor device 10 of FIG. 5 at a further stage in the manufacturing process. Photoresist 31 of FIG. 5 has been removed. Portions of dielectric layer 30 have been ground away using a chemical, mechanical polishing method in accordance with techniques well known to those skilled in the art, leaving shallow trench isolation structures 24.

FIG. 6 illustrates semiconductor device 10 of FIG. 5 at a further stage in the manufacturing process. Photoresist 31 of FIG. 5 has been removed. Portions of dielectric layer 30 have been grinded away using a chemical, mechanical polishing method in accordance with techniques well known to those skilled in the art, leaving shallow trench isolation structures 24.

Shallow trench isolation structures 24 are adjacent a portion of active region 18. Shallow trench isolation structures 24 provide isolation between active regions of semiconductor device 10. Shallow trench isolation structures 24 may have a depth of approximately 3,000 to 10,000 angstroms. The depth of shallow trench isolation structures 24 may also be equal to the depth of collector contact regions 26 due to the formation process of shallow trench isolation structures 24.

As stated above, collector contacts may be subsequently formed within collector contact regions 26. This will enable the collector contacts to be formed closer to buried layer 16, reducing the need for ion implantation steps or other methods to facilitate the electrical contact between the collector contacts and buried layer 16.

Forming collector contacts within collector contact regions 26 in this manner provides several technical advantages. Less lithographic steps are needed to complete the process since the openings for the formation of the collector contacts are formed when forming shallow trench isolation structures 24. Furthermore, high energy ion implantation may not be required for a subsequently-formed collector to electrically contact buried layer 16 since the collector can be formed within collector contact regions 26.

Standard processing steps are undertaken to complete the manufacture of semiconductor device 10. Such processing steps may include the formation of base layers, dielectric portions, silicide portions, spacers and other layers and/or structures well known to those skilled in the art. Appropriate metal interconnections are formed and passivation is undertaken. Source/drain or extrinsic base ion implants and diffusion may be performed to further complete the connection with buried layer 16. Other appropriate methods or steps may be performed to complete the manufacture of semiconductor device 10.

Figure 7:
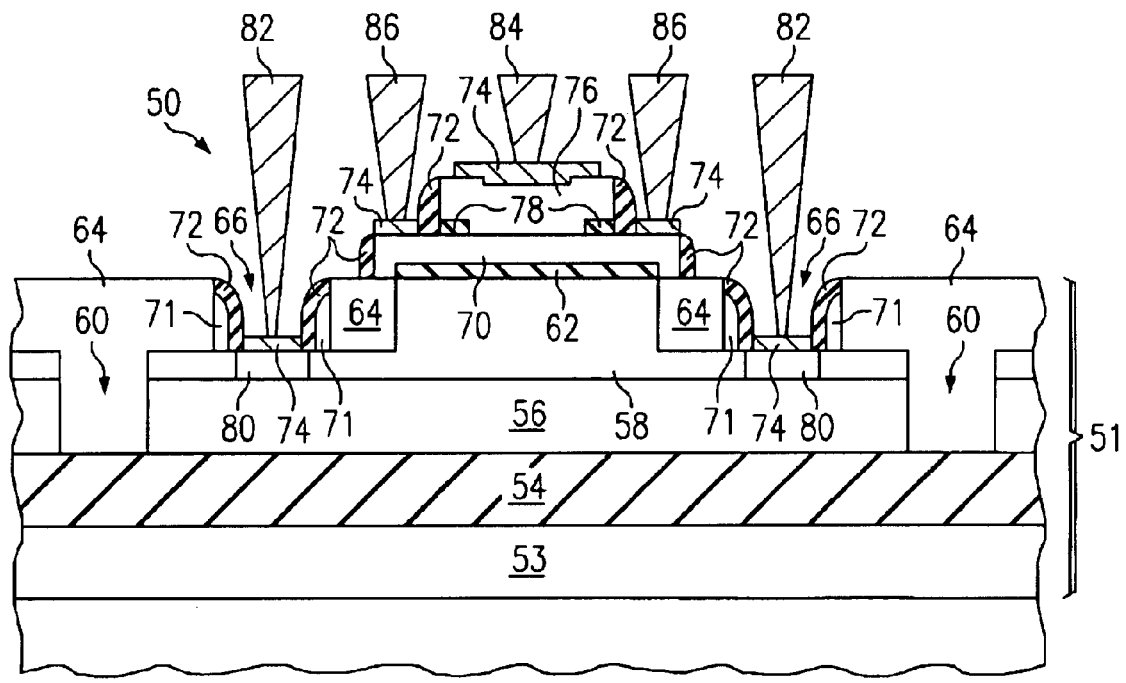
FIG. 7 is a cross-sectional diagram illustrating a semiconductor device with collector and emitter contacts at one stage of a manufacturing process, in accordance with a particular embodiment of the present invention.

FIG. 7 illustrates a semiconductor device 50 at one stage of a manufacturing process, in accordance with an embodiment of the present invention. Semiconductor device 50 includes collector contact regions 66 formed using techniques of the present invention. Collector contacts may be subsequently formed within collector contact regions 66 to provide electrical contact with a buried layer 56 without using sinkers that require extra lithographic steps and high energy implants.

Semiconductor device 50 includes semiconductor substrate 51 which comprises wafer 53. Semiconductor substrate 51 includes oxide layer 54, buried layer 56, active region 58 and nitride layer 62. Buried layer 16 may either be negatively-doped to form an NBL or positively-doped to form a PBL.

Semiconductor device 50 includes deep trench isolation structures 60 which provide isolation between elements of semiconductor device 50 during use of semiconductor device 50. Shallow trench isolation structures 64 provide isolation between active regions of semiconductor device 50.

Semiconductor device 50 includes a base layer 70 that comprises a polysilicon material, such as a silicon germanium polysilicon. Through the formation of base layer 70, residual portions 71 exist within collector contact regions 66. Semiconductor device 50 also includes spacers 72 which comprise any suitable material, such as a nitride or a material with a low dielectric coefficient.

An emitter contact layer 76 is formed adjacent base layer 70. Emitter contact layer 76 comprises a polysilicon material. Dielectric portions 78 are formed adjacent emitter contact 76 using any of a variety of techniques well known to those of ordinary skill in the art. Silicide layers 74 are formed and source/drain implants 80 are made to facilitate the electrical connection between collector contacts 82 and buried layer 56 within collector contact regions 66. Collector contacts 82, emitter contact 84 and base contacts 86 are formed adjacent silicide layers 74. Collector contacts 82, formed within collector contact regions 66, may electrically contact buried layer 56.

Figure 8:
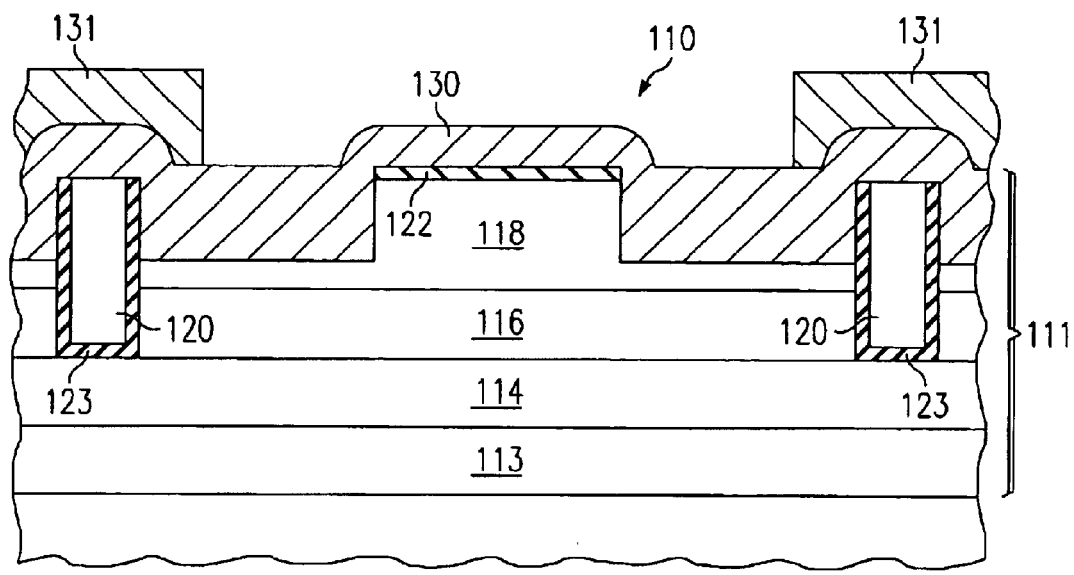
FIG. 8 is a cross-sectional diagram illustrating a semiconductor device with a dielectric layer and photoresist at one stage of a manufacturing process, in accordance with a particular embodiment of the present invention.

FIG. 8 illustrates a semiconductor device 110 at one stage of a manufacturing process, in accordance with another embodiment of the present invention. Semiconductor device 110 includes semiconductor substrate 111 which comprises wafer 113, oxide layer 114, buried layer 116 and active region 118. Nitride layer 122 is formed adjacent active region 118. Deep trench isolation structures 120 with liner oxide 123 are formed adjacent a portion of buried layer 116. Dielectric layer 130 is formed adjacent active region 118. Photoresist 131 is formed adjacent portions of dielectric layer 130.

Figure 9:
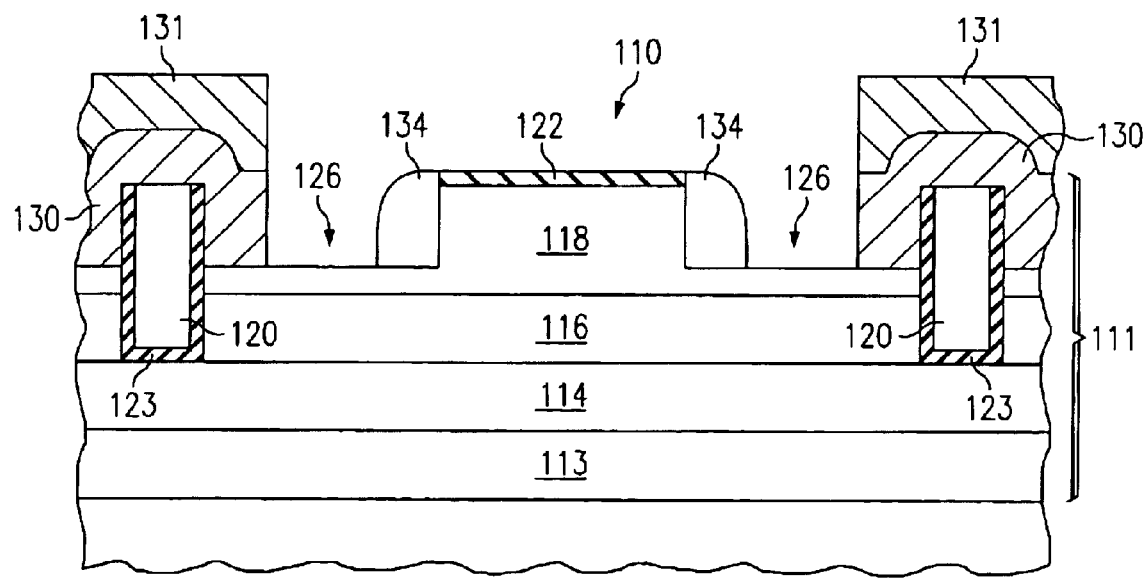
FIG. 9 is a cross-sectional diagram illustrating the semiconductor device of FIG. 8 with collector contact regions and shallow trench isolation spacers at another stage of a manufacturing process, in accordance with a particular embodiment of the present invention.

FIG. 9 illustrates semiconductor device 110 of FIG. 8 at a further stage in the manufacturing process. Collector contact regions 126 and shallow trench isolation spacers 134 have been formed. An etchant, plasma or other material is used to react with the areas of dielectric layer 130 of FIG. 8 which were not covered by photoresist 131. Such areas of dielectric layer 131 are etched away leaving collector contact regions 126 and shallow trench isolation spacers 134.

This process of formation can enable a manufacturer to form collector contact regions 126 having a specific width. For example, the lateral dimension of collector contact regions 126 can be smaller than collector contact regions 126 formed without shallow trench isolation spacers 134. This method can also help to minimize parasitics and resistances during the operation of semiconductor device 110 as a result of a smaller lateral dimension of collector contact regions 126. Furthermore, residuals that can accumulate within collector contact regions 126 during the subsequent manufacturing process can be reduced or eliminated.

Figure 10:
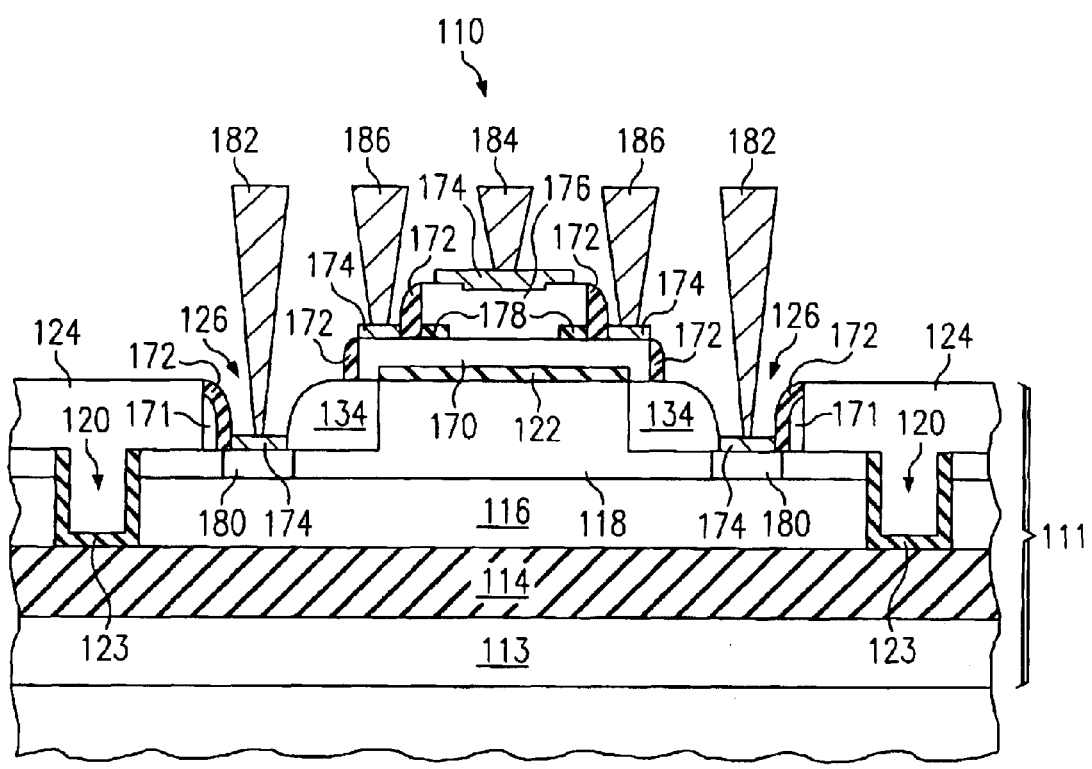
FIG. 10 is a cross-sectional diagram illustrating the semiconductor device of FIG. 9 with collector and emitter contacts at another stage of a manufacturing process, in accordance with a particular embodiment of the present invention.

FIG. 10 illustrates semiconductor device 110 of FIG. 9 at a further stage in the manufacturing process. Semiconductor device 110 includes shallow trench isolation structures 124, base layer 170, residual portions 171, spacers 172, silicide layers 174, emitter contact layer 176, dielectric portions 178, source/drain implants 180, collector contacts 182, emitter contact 184 and base contacts 186. Collector contacts 182 are formed within collector contact regions 126. Components of semiconductor device 110 may be formed according to the techniques discussed herein with regard to other embodiments of the present invention.

The illustrated embodiments incorporate embodiments of the invention in a bipolar technology. Particular embodiments of the present invention may be incorporated into bipolar complementary metal oxide semiconductor (BiCMOS) and complementary bipolar complementary metal oxide semiconductor (CBiCMOS) that utilize shallow trench isolation as well. Other technologies well known to those of ordinary skill in the art may utilize particular embodiments of the present invention as well.

Although particular configurations and methods have been illustrated for particular embodiments of the present invention, other embodiments may include other configurations and/or methods. The present invention has been described in detail; however, various changes and modifications may be suggested to one skilled in the art. It is intended that the present invention encompass such changes and modifications as falling within the scope of the appended claims.

What is claimed is:

1. A semiconductor device, comprising:
   a buried layer of a semiconductor substrate;
   an active region having a bottom surface adjacent at least a portion of the buried layer and a first top surface distant from the buried layer;
   a depressed well-region in the active region having a bottom surface substantially parallel the first top surface;
   a shallow trench isolation structure in the well-region adjacent a portion of the active region;
   a collector contact region in the well-region adjacent the active region and a portion of the shallow trench isolation structure,
   wherein the collector contact region has a depth approximately equal to a depth of the shallow trench isolation structure; and
   a collector contact formed at the collect contact region operable to electrically contact the buried layer, communicating with a heavily doped region in the active region.

2. A semiconductor device, comprising:
   a buried layer of a semiconductor substrate;
   an active region having a bottom surface adjacent at least a portion of the buried layer and a first top surface distant from the buried layer;
   a depressed well-region in the active region having a bottom surface substantially parallel the first ton surface;
   a shallow trench isolation structure in the well-region adjacent a portion of the active region;
   a collector contact region in the well-region adjacent the active region and a portion of the shallow trench isolation structure.
   wherein the collector contact region has a depth approximately equal to a depth of the shallow trench isolation structure; and
   a first isolation structure adjacent at least a portion of the buried layer comprising a deep trench isolation structure.

3. The semiconductor device of claim 2, wherein the deep trench isolation structure comprises a linear oxide.

4. A semiconductor device, comprising:
   a buried layer of a semiconductor substrate;
   an active region having a bottom surface adjacent at least a portion of the buried layer and a first top surface distant from the buried layer;
   a depressed well-region in the active region having a bottom surface substantially parallel the first top surface;
   a shallow trench isolation structure in the well-region adjacent a portion of the active region;
   a collector contact region in the well-region adjacent the active region and a portion of the shallow trench isolation structure,
   wherein the collector contact region has a death approximately eaual to a depth of the shallow trench isolation structure; and
   a collector contact formed at the collect contact region operable to electrically contact the buried layer, contacting the buried layer through a doped region in the active region.

5. The semiconductor device of claim 4, in which the doped region extends to the buried layer.

6. A semiconductor device, comprising:
   a semiconducting layer;
   an insulating layer over the semiconductor layer;
   a buried layer over the insulating layer;
   an active region of epitaxial semiconductor material having a bottom surface adjacent a portion of the buried layer and a first top surface distant from the buried layer;
   a first isolation structure downwardly extending to the insulating layer;
   a depressed well-region in the active region, free of the epitaxial semiconductor material, having a bottom surface substantially parallel the first top surface;
   a shallow trench isolation structure in the well-region adjacent a portion of the active region;
   a contact region in the well-region adjacent the active region and a portion of the shallow trench isolation structure;
   a contact in the contact region electrically communicable to the buried layer; and
   a silicide region near the bottom surface of the well-region.

7. The semiconductor device of claim 6, in which the silicide region contacts the buried layer.

8. The semiconductor device of claim 6, in which the silicide region contacts a heavily doped region in the active region.

9. The semiconductor device of claim 8, in which the heavily doped region contacts the buried layer.

* * * * *